(12) United States Patent
Yao et al.

(10) Patent No.: US 6,348,788 B1
(45) Date of Patent: Feb. 19, 2002

(54) HIGH RESOLUTION CURRENT SENSING APPARATUS

(75) Inventors: Jun Jason Yao, Thousand Oaks; Gerard J. Sullivan, Newbury Park; Robert J. Anderson, Thousand Oaks, all of CA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/406,509

(22) Filed: Sep. 28, 1999

(51) Int. Cl.7 .......................... G01R 33/02; G01R 27/26
(52) U.S. Cl. .................. 324/99 R; 324/117 R; 324/259; 324/260
(58) Field of Search ................. 324/661, 99 R, 324/99 D, 98, 244, 260, 259, 252, 117 R, 117 H, 684, 658; 177/210 C; 340/664, 686.1

(56) References Cited

U.S. PATENT DOCUMENTS

| | | | | |
|---|---|---|---|---|
| RE23,850 E | * | 7/1954 | Roper | ...................... 324/99 R |
| 4,705,127 A | * | 11/1987 | Kunz | .......................... 177/210 |
| 4,754,823 A | * | 7/1988 | Baumann | ................. 177/210 C |
| 5,739,686 A | * | 4/1998 | Naughton et al. | ........... 324/260 |

* cited by examiner

Primary Examiner—Vinh P. Nguyen
(74) Attorney, Agent, or Firm—Patrick S. Yoder; Alexander M. Gerasimow; William R. Walbrun

(57) ABSTRACT

A current sensor includes a deflectable member disposed in a magnetic field. Nulling or compensating members may be mechanically coupled to the deflectable member. Feedback or readout devices coupled to the structure provide signals indicative of deflection of the deflectable member under the influence of applied current and the magnetic field. Nulling current applied to the nulling members tends to oppose deflection of the deflectable member. The nulling current may be modulated to drive the feedback signal to a desired level and is used as a basis for calculating the current to be measured. The current may be measured directly upon calibration of feedback devices coupled to the deflectable member or to the nulling members. Arrays of sensors may be coupled to common busses for applying measured and nulling currents to sensors of the arrays and for detecting feedback signals.

23 Claims, 3 Drawing Sheets

FIG. 1
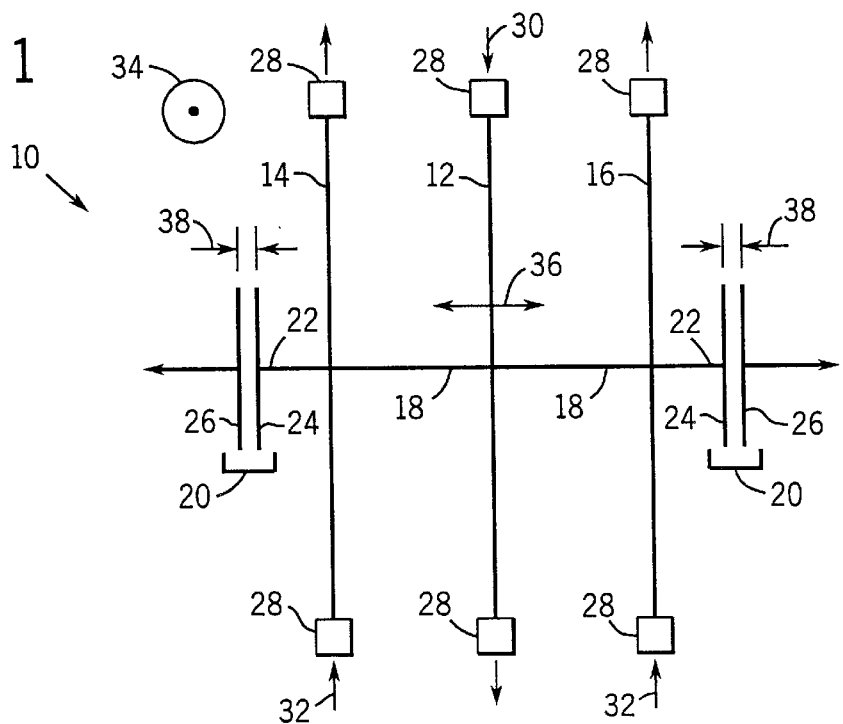
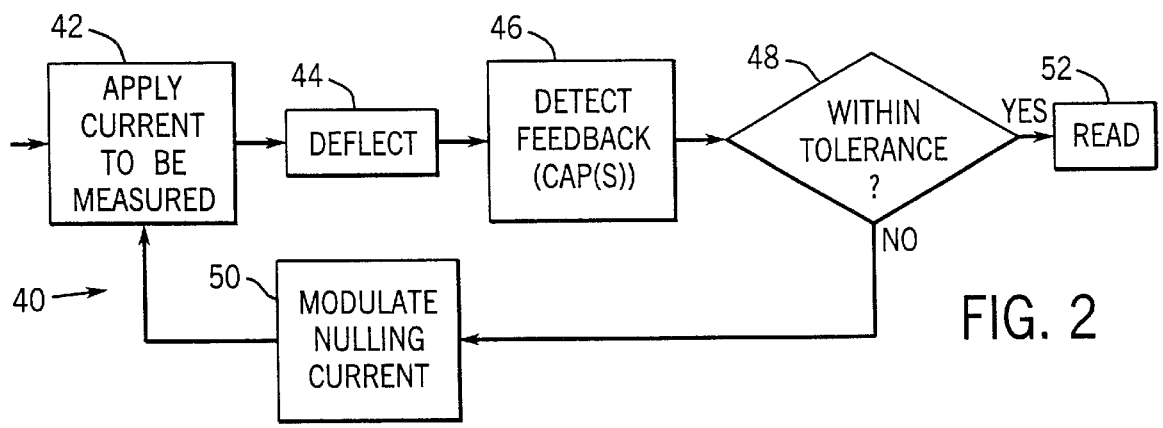
FIG. 2
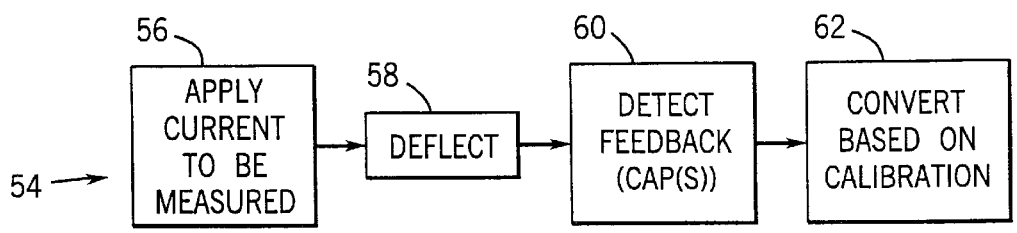
FIG. 3

HIGH RESOLUTION CURRENT SENSING APPARATUS

BACKGROUND OF THE INVENTION

1. Field of the Invention

The present invention relates generally to the field of electrical current sensing devices such as those used in programmable logic controllers and other environments. More particularly, the invention relates to a technique for sensing current with very high resolution in a device which can be at least partially formed in large quantities through micro-machining and similar techniques.

2. Description of the Related Art

A wide range of applications exist for devices capable of accurately sensing electrical current. In certain applications, current is sensed for simple readout, such as on a metered scale or digital display. A considerable number of applications, however, require current to be sensed for use in regulation of power or as feedback for the control of machines, circuits, and processes.

In the industrial environment, for example, feedback devices and actuators typically operate within specified current and voltage ranges. Feedback from sensors may assume values within the acceptable range, with the values reflecting physical parameters of a controlled system. One such application is in programmable logic controllers (PLC's) in which a 4–20 ma current range is typically provided for control and feedback. To enhance the performance of systems incorporating these devices, it is often desirable to obtain very high resolution current sensing in a manner which avoids unnecessary power drain from the associated circuitry or system.

Digital current sensors presently in use in applications such as PLC's suffer from several drawbacks. In certain known 4–20 ma current sensors, for example, isolation from perturbations which may be caused by external circuitry is achieved by electrically "floating" an analog-to-digital converter and its associated electronics. This involves a floating power supply circuit which uses a DC-to-DC converter which receives an input from a 5 volt DC power supply, converts it to an AC signal, transforms the AC signal for isolation, and reconverts the AC signal into DC power. The isolated electronics then communicate with non-isolated electronics through a pair of digital opto-isolators. These isolators are then coupled to a clock and to an output which returns digital values in serial form. However, opto-isolators used in such devices are, in general, unsuitable for use in an analog fashion for resolutions higher than 6–8 bits, due to their temperature dependency and drift. Moreover, to reduce costs in such sensor circuitry, analog inputs for a single module are generally not isolated from one another so that they can share a same floating power supply.

An important drawback in present state-of-the-art current sensors is their unit cost. Even in applications where a single current sensor suffices for feedback or control, sensors of the type described above can add significantly to the overall system price. Moreover, in many PLC applications, it is desirable to provide current sensors on many or all outputs of a PLC to monitor output current for system control, as well as for diagnostic monitoring, such as for output protection. As noted above, similar high resolution, low cost requirements exist for sensing on input channels of PLC's and other devices.

Still further drawbacks in existing technologies include inconsistencies in device-to-device performance, in compatibility with microelectronics, parasitic losses, and the physical dimensions of the current sensor and associated circuitry. These and the foregoing drawbacks can further lead to problems with energy dissipation, heating and other thermodynamic and performance problems.

There is a need, therefore, for an improved technique for providing high resolution current sensing at a relatively low cost for both the sensing device and its associated circuit. There is, at present, a particular need for a current sensing technique which offers enhanced performance in a reduced package size, facilitating both manufacturing and incorporation into electrical and microelectronic devices such as PLC's.

SUMMARY OF THE INVENTION

The present invention provides a current sensing technique designed to respond to these needs. The technique is particularly well suited to floating current sensing, such as in a floating current input stage or an output stage of a PLC. However, the technique may be used in a wide range of devices, both for control, feedback and monitoring functions. The technique employs microelectro-mechanical systems (MEMS) features to form a small, cost effective unit which may be employed in single modules or in module arrays.

The basic module formed in accordance with aspects of the present technique includes a deflectable member disposed in a magnetic field. A current to be measure or sensed is applied to the deflectable member, urging the deflection of the member by interaction of the magnetic field with the electromagnetic field produced by the flowing current. Feedback or output devices are coupled to the deflectable member. In a preferred embodiment, the feedback device includes a capacitor, outputvoltage of which varies with deflection of the member.

The deflectable member and the feedback, or output device may be employed either in an open loop or a closed loop setting. In a particularly preferred configuration, a pair of additional deflectable members flank the deflectable member to which the sensed current is applied. These additional members are mechanically linked to the sensed current member. Feedback devices, such as micromachined capacitors may be provided on either side of the additional deflectable members. Nulling currents may be passed through the additional deflectable members to counter the deflection of the sensed current member. By driving the feedback to a null level or into a known tolerance range, the current applied to the sensed current member is determined based upon the level of the nulling current. In an open loop configuration, the output of one or more feedback or readout devices, such as micromachined capacitors, may be evaluated directly to provide an indication of the sensed current.

The technique provides significantly enhanced resolution as compared to heretofore known devices. For example, a current sensor in accordance with the present technique may provide output resolution of 12–16 bits over an operating range of 4–20 ma. It does not require a floating power supply, and analog inputs from single modules may be isolated from one another without additional expense. Where desired, arrays of large numbers of the modules may be easily formed and coupled to one another for enhanced performance.

BRIEF DESCRIPTION OF THE DRAWINGS

The foregoing and other advantages of the invention will become apparent upon reading the following detailed description and upon reference to the drawings in which:

FIG. 1 is a diagrammatical representation of a current sensor employing the present technique for measuring current through a closed loop arrangement;

FIG. 2 is a block diagram indicating exemplary logical steps in closed loop current sensing employing a structure such as that represented in FIG. 1;

FIG. 3 is a similar block diagram of an open loop technique for sensing current;

DETAILED DESCRIPTION OF SPECIFIC EMBODIMENTS

Figure 4:
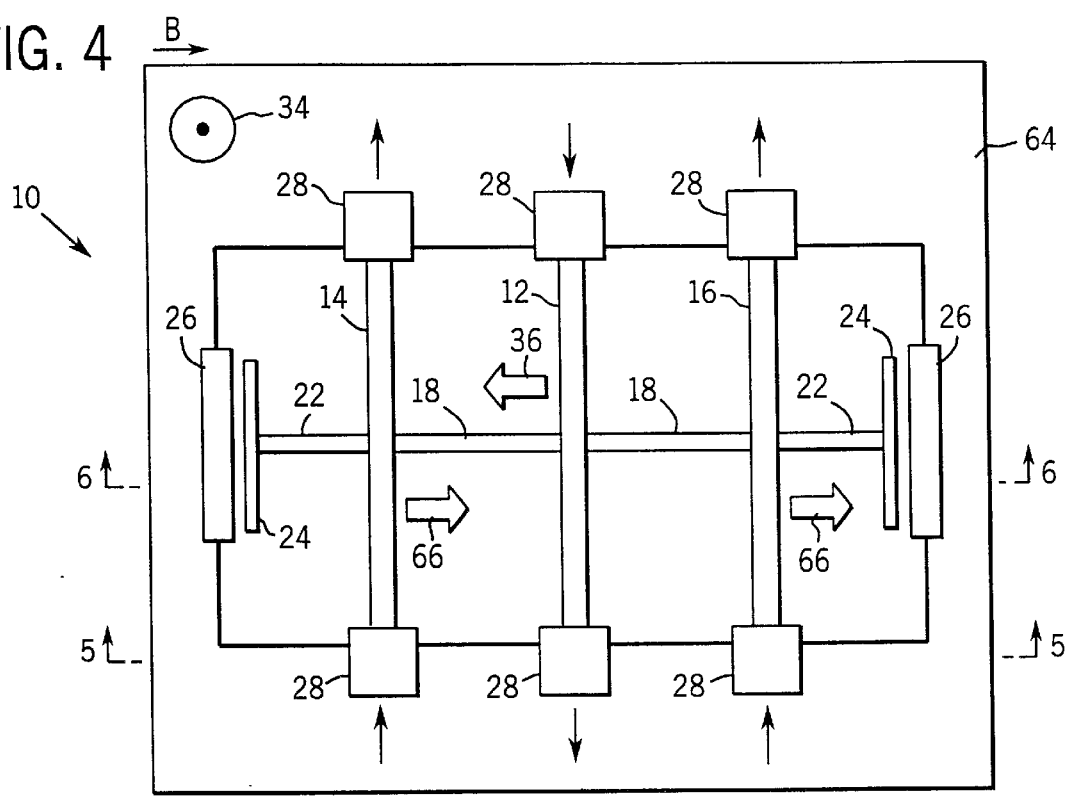
FIG. 4 is a physical diagram of an exemplary MEMS current sensor of the type illustrated in FIG. 1.

Turning now to the drawings, and referring first to FIG. 1, a current sensing module 10, in accordance with certain aspects of the present invention, is illustrated diagrammatically. The current sensing module of FIG. 1 is designed to receive both a sensed or to be measured current and a nulling current, and to produce signals indicative of balance between the measured and nulling currents. As described below, the device may be adapted to measure current directly without nulling, in an open-loop manner. The closed-loop configuration of FIG. 1, however, includes a measurement beam 12 flanked by a pair of nulling beams 14 and 16. Beams 12, 14 and 16 are deflectable by virtue of their inherent elasticity under the influence of electric currents flowing in the presence of a magnetic field.

Measurement beam 12 and nulling beams 14 and 16 are mechanically coupled to one another by a pair of connecting members 18. Connecting members 18 permit forces tending to deflect beams 12, 14 and 16 to co-act so as to cause deflection of all of the beams under combined forces exerted on each as described below. In the illustrated embodiment, a pair of feedback or readout devices in the form of capacitors 20 are provided for measuring relative deflection of the system defined by beams 12, 14 and 16, and by connecting members 18. Each of the capacitors is linked to the system by additional connecting members 22.

Each capacitor 20 includes a pair of electrodes 24 and 26. Electrode 24 is linked to connecting member 22 and moves with the deflectable system defined by beams 12, 14 and 16. As described more fully below, while connecting members 18 electrically isolate beams 12, 14 and 16, connecting members 22 electrically couple beams 14 and 16 to respective electrodes 24 of each capacitor so as to maintain the same electrical potential within beams 14 and 16, and electrodes 24. Electrode 26 is maintained stationary within each capacitor.

Beams 12, 14 and 16 are configured to receive electrical currents for the measurement technique described below. Thus, each beam is provided with a pair of conductive terminal pads 28, with one pad being provided at each end thereof. Terminal pads 28 are made of a conductive material such that current may be channeled through the beams. In the embodiment illustrated in FIG. 1, a current to be measured is applied to measurement beam 12 as indicated by arrow 30. A compensating or nulling current is applied to beams 14 and 16 as indicated by arrows 32. The currents are applied in the presence of a uniform magnetic field, as indicated generally at reference numeral 34. By virtue of the interaction of the fields resulting from the current flow, and of the magnetic field, beams 12, 14 and 16, coupled to one another via connecting members 18, are deflected laterally as indicated by arrow 36 in FIG. 1. Moreover, electrodes 24 and 26 of each feedback capacitor 20 are spaced from one another by a distance 38 which varies as the beams are deflected. The variation in the gaps 38 of each capacitor thus result in changes in electrical potential sensed at electrodes 26. As described more fully below, by providing inverted polarities between the currents flowing through the measurement and nulling beams, and by monitoring output from the feedback devices, the current applied to measurement beam 12 is detected either in open or closed loop techniques.

FIG. 2 represents exemplary control logic for sensing and measuring current in the device illustrated in FIG. 1 in accordance with a closed loop technique. The control logic, designated generally by reference numeral 40, begins at step 42 wherein the current to be measured is applied to the deflectable member or measurement beam 12. As noted above, the current is applied in a first known polarity by terminating the device at pads 28 of beam 12. As current flows through beam 12, the beam is urged to deflect as indicated at block 44 of FIG. 2. This deflection is generally governed by factors such as the flux density of magnetic field 34, the current through beam 12, generating a field in accordance with the right-hand rule which is a function of the current, and the mechanical rigidity of the beam system. As this current is applied, electrical potential is sensed from capacitors 20 as a feedback signal, as indicated at block 46. At block 48, a control circuit coupled to the sensor module determines whether the feedback signal is within a desired tolerance. This tolerance may be a given ratio of the potentials between capacitors 20 on either side of the module, or a given percentage of a known or calibrated potential. If the beam system is deflected more than the desired tolerance, the response to block 48 will be negative, resulting in modulation of nulling currents applied to beams 14 and 16, as indicated at block 50.

As the nulling or compensation current is applied to beams 14 and 16, in a polarity opposite that of the measured current applied to beam 12, the beam system will be urged back to a non-deflected position by interaction of fields generated about beams 14 and 16 and the magnetic field 34. By modulating the nulling current in this closed loop manner, the deflection of the beam system is driven to a level at which feedback from capacitors 20 falls within a desired tolerance or dead band. At this point of balance, the nulling or compensation current is read, as indicated at block 52 in FIG. 2, to provide an indication of the current to be measured. As will be apparent to those skilled in the art, calibration of module 10 permits nulling or compensation currents to be translated into values representative of the measured current due to the physical properties of the beam system.

The output voltage of the feedback capacitors of the embodiment of FIG. 1 may be defined by the relationship:

$$V_{out} = \left[\frac{V_1+V_2}{2} + \frac{V_1-V_2}{2}\right]\frac{\Delta\varepsilon}{C},$$

Where C is the structural capacitance, ΔC is the change in the capacitance due to deflection of the beam system, and $V_1$ and $V_2$ are the voltages applied to the capacitor electrodes. If $V_1$ and $V_2$ are 180° out of phase with one another, the output voltage may be expressed:

$$V_{out} = \left[\frac{V_1+V_2}{2}\right]\frac{\Delta\varepsilon}{C},$$

Where two nulling or compensating beams are provided, the measured current will generally equal twice the nulling current when the value $V_{out}$ approaches zero (ΔC=0). The system may be further calibrated to account for any mechanical or electronic variations or tolerances, where desired.

It should be noted that the input impedance of the current sensor described above is small due to the input current flowing through a metal conductor. All measurements are performed in the closed loop embodiment by the nulling current. Moreover, the input current is electrically isolated at the input stage (at terminal pads 28 of the measurement beam) and is mechanically coupled to the remainder of the device components. Thus, the structure permits the elimination of the floating power supply of heretofore known sensors. Where a number of modules are employed, as described below, inputs of each module are easily isolated from one another.

By employing the nulling current technique to actively cancel the electromagnetic force generated by application of the input or measured current, the magnitude of the magnetic field applied to the device need not be precisely known. That is, the influence of the magnetic field on both the sensing and nulling beams of the closed loop technique effectively cancel the field strength term in the mathematical description of the system. Consequently, any magnetic field noise, such as earth magnetic field or fields generated by nearby machines, will not generally affect the accuracy of the current sensor. Rather, sensitivity of the current sensor will generally be enhanced by increases in the total magnetic field perpendicular to the beam system.

The structure and technique for closed loop sensing is also enhanced by the provision of nulling beams flanking either side of the sensing beam. For example, the favored structure minimizes mechanical torque on the system by balancing forces on either side of the measurement beam. Similarly, temperature variations on the various beams, connecting members, and support structures will typically affect the entire system in a fairly uniform and compensating manner.

FIG. 3 illustrates exemplary control logic for measuring current through a simplified open loop technique. This control logic, designated generally by reference numeral 54 in FIG. 3, may be applied to a device like that shown in FIG. 1, or to a simplified device wherein a measurement beam 12 is coupled directly to one or more readout devices, such as a capacitor 20 of the type shown in FIG. 1. In the open loop method, the current to be measured is applied to the deflectable beam 12 as indicated at block 56. Again, the current is applied in the presence of the magnetic field 34. Depending upon the flux density of the field, the current level, and the rigidity of the deflectable beam system, beam 12 is caused to deflect as indicated at block 58, resulting in variation of a gap 38 within the capacitor readout device. The output of the device is detected at block 60, and converted at block 62.

As in the previous technique, the output of the readout device or devices may be converted to a value representative of the measured current based upon calibrated conversion factors which will be a function of the magnetic field strength, the measured current values, and the mechanical properties of the deflectable beam system.

Figure 5:
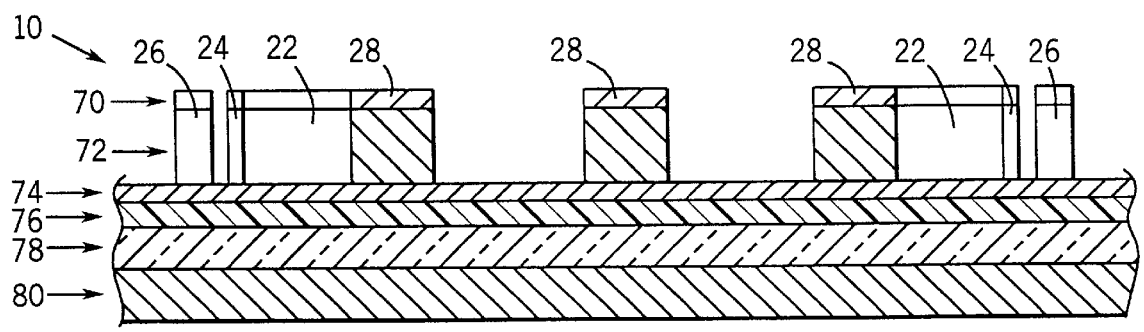
FIG. 5 is a sectional view of the sensor of FIG. 4 taken along line 5—5.
Figure 6:
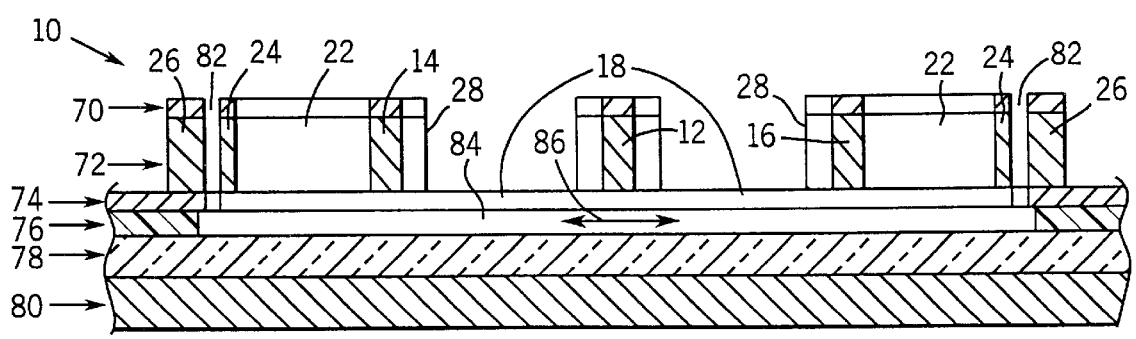
FIG. 6 is a sectional view of the sensor of FIG. 4 taken along line 6—6.

FIGS. 4, 5 and 6 illustrate a presently preferred physical implementation of the current sensing module 10 described above. As mentioned with respect to FIG. 1, the module includes deflectable members 12, 14 and 16 supported for lateral movement. Ends of each member are supported by posts at which terminal pads 28 are provided. Mechanical connecting members 18 extend between the deflectable beams for maintaining a uniform movement of the beams under the influence of applied currents. Additional connecting members 22, preferably including conductive elements as described below, extend between the nulling or compensating beams 14 and 16, and an electrode 24 of each feedback device. The other electrode 26 of each feedback or readout device is fixed in the module and is coupled to external circuitry (not shown).

The foregoing structures are provided on a substrate 64. Moreover, the various components of the module 10 may be formed on the substrate by adding successive layers of desired materials, and removing regions of certain of the layers in MEMS processing steps. In the resulting structure, then, beam 12, and other elements of the deflectable system, will react to currents by deflecting as indicated at arrow 36. Forces tending to cause such deflection are opposed by oppositely-oriented forces on the nulling or compensating beams 14 and 16, as indicated at arrows 66 in FIG. 4.

FIG. 5 illustrates an exemplary layered configuration of the module 10 shown in FIG. 4, taken along line 5—5. In the illustrated embodiment, successive layers form the components described above, including a conductive layer 70, a structural layer 72, an insulating layer 74, an epoxy layer 76, a glass layer 78, and a magnet layer 80. Layers 70, 72 and 74 combine to form a device layer, in which the deflectable beam structure, feedback or readout devices, and terminal pads are provided. Layers 76, 78 and 80, in turn, form a substrate on which the device layer is supported. In a presently preferred embodiment, metal layer 70 is formed of a highly conductive metal, such as aluminum or copper. Layer 72 is made of a structural material adding to the mechanical integrity and desired rigidity of the system. In the present embodiment, layer 72 is made of silicon or polysilicon. Insulting layer 74, which generally serves to form a base of the device layer, and to link the deflectable members to one another, is made of $SiO_2$. Layer 76 comprises a suitable epoxy interposed between insulating layer 74 and glass layer 78. Glass layer 78, in turn, is made of a suitable insulating glass material of relatively low coefficient of thermal expansion. Such material is commercially available under the tradename Vycor. Finally, magnet layer 70 may be made of any suitable magnetic material capable of creating the field described above. For example, magnet layer 80 may be made of a magnetic material impregnated polymer.

FIGS. 5 and 6 illustrate the layered structure described above, including the features defining the sensor components. As shown in FIG. 5, the layered structure is preferably built by a series of assembly and deposition steps beginning with silicon layer 72 (e.g. 3 μm thickness), the $SiO_2$ layer 74, the epoxy layer 76, the glass layer 78, and the magnet layer 80. With the additional conductor layer 70 disposed thereon (e.g. <1 μm thickness), the resulting structure is subsequently etched to define the spaces of gaps illustrated in FIG.

5 between the terminal pads 28, the underlying beam structures and support posts, and electrodes 24 and 26.

At best illustrated in FIG. 6, the etching process, is continued to permit deflection or flexibility in the beam structure of the sensor module. In particular, a cavity is etched into epoxy layer 76, such as completely to glass layer 78, forming openings or gaps 82 between electrodes 24 and 26. These gaps, which serve to define the variable gaps 38 of the module (see FIG. 1), continue to the cavity surrounded by the etched epoxy layer 76. The silicon layer 72 is similarly etched to the glass layer 78, to form a cavity extending to the gaps 82. However, the photoresist and etching process is adapted to etch below connecting members 18, while leaving the connecting members intact and extending between beams 12, 14 and 16.

In the resulting structure, the beam system is supported, yet deflectable under the influence of the applied currents and magnetic field, which is preferably oriented perpendicular to the plane of the deflectable beams. In particular, as best illustrated in FIG. 6, the beams are linked to one another by connecting members 18 in the $SiO_2$ layer 74, and are suspended above cavity 84, being supported on the columns created below terminal pads 28 (see FIG. 4). The entire structure, then, may be displaced laterally as indicated by arrow 86 in FIG. 6. It should also be noted in FIGS. 5 and 6, that in the illustrated embodiment the conductive layer 70 is contiguous over beams 14 and 16, connecting members 22 and electrodes 24. Thus, when placed in operation, electrodes 24 remain at a common electrical potential with beams 14 and 16.

Figure 7:
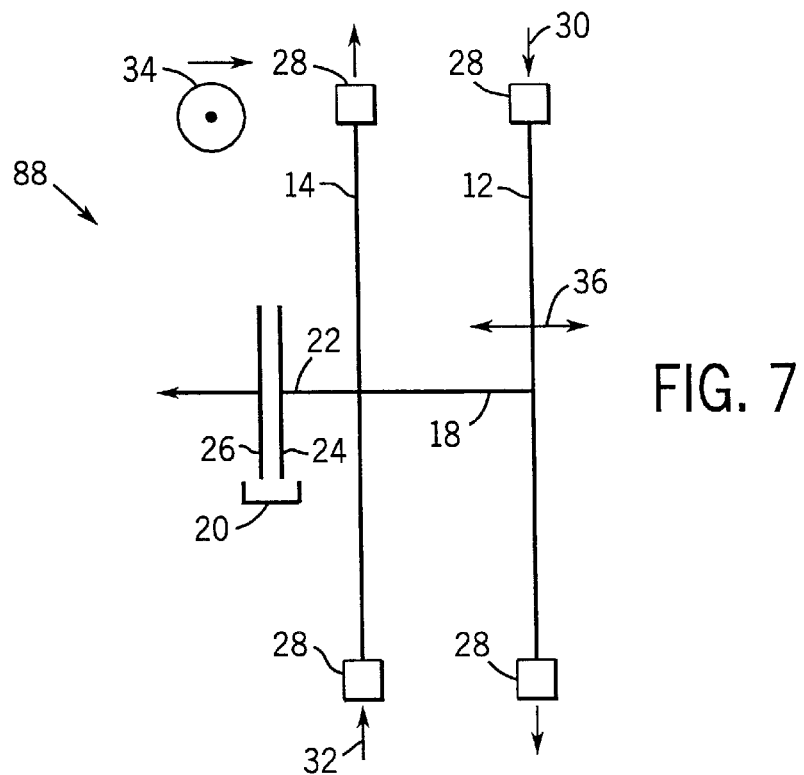
FIG. 7 is a diagrammatical representation of a current sensor employing a single nulling member and a single feedback device.
Figure 8:
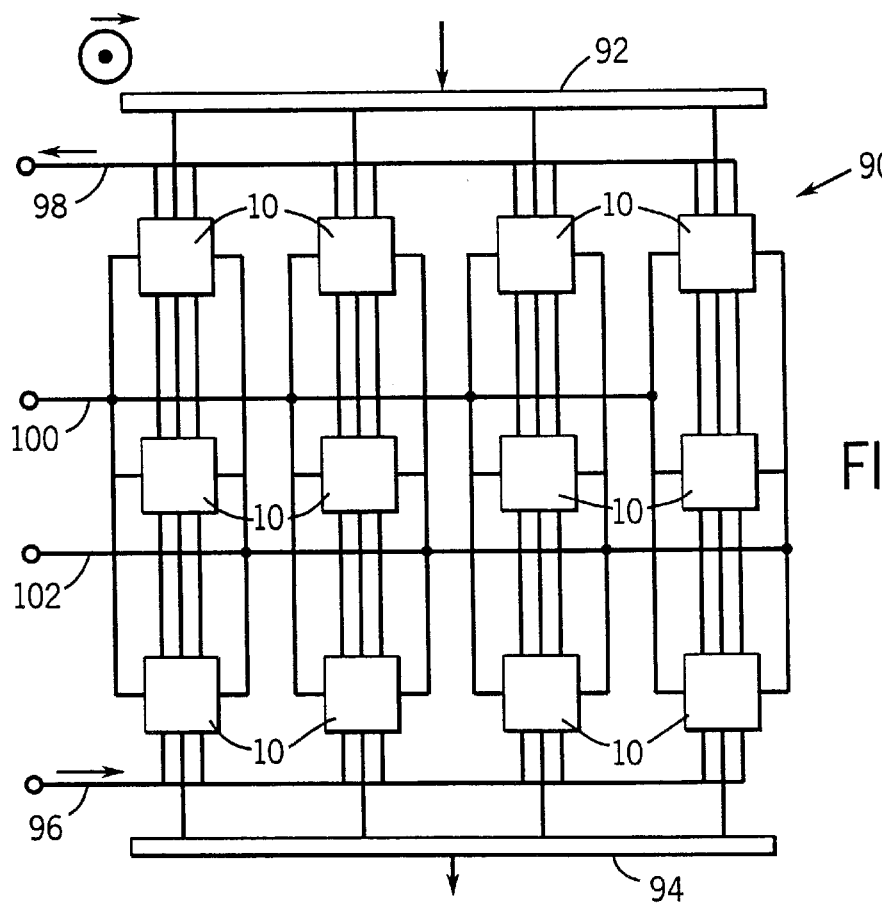
FIG. 8 is a diagrammatical representation of an array of current sensing modules coupled to one another for measurement of a single current with a single feedback or output.

As noted above, various modifications can be made to the foregoing structure, both reducing the number of components, or increasing the number of sensing modules. FIGS. 7 and 8 illustrate two such variations. In the alternative embodiment of FIG. 7, a simplified sensing module, designated generally by the reference numeral 88, includes a single sensing beam 12, and a single nulling or compensating beam 14. Again, both beams are provided in a magnetic field as illustrated by reference numeral 34. Also, both beams are provided with terminal pads 28 for completing electrical connections used to place the circuitry in a sensing device. A single feedback device, such as capacitor 20, may be employed in the structure, again coupled to the beam system by an appropriate connecting member 22. It should be noted that other alternative structures may be envisaged, such as structures in which the feedback device is mechanically coupled to the sensing beam 12, and structures in which the feedback device is separately powered, such as at a known electrical potential different from that applied to beam 14.

FIG. 8 illustrates an array of current sensors defining a sensing package, designated generally by the reference numeral 90. Package 90 includes an array of sensing modules 10 of the type described above. In the illustrated embodiment, 12 such modules are provided, although the number of sensing modules may, of course, vary depending upon such factors as the level and nature of the current to be sensed, and the accuracy or resolution desired. In the illustrated package, a current input bus 92 is provided and linked to each of the modules in the array. A current output bus 94 is provided, similarly linked to the modules. Buses 92 and 94 serve to apply the current to be sensed. Similar buses 96 and 98 are provided for the nulling or compensating current. As noted above, for closed loop current sensing, such nulling or compensating currents may be provided for controlling deflection of the sensor beam systems as an indication of the measured current. Finally, feedback buses 100 and 102 are provided and are linked to the feedback devices within each module 10.

The foregoing embodiments are preferably manufactured by MEMS techniques of the type described above. In a presently preferred manufacturing sequence, a large number of such devices may be fabricated on single crystal silicon wafers to form the layered structure described, employing deposition, etching or other machining steps to define the components of the current sensing modules. Following such fabrication, the modules are separated and may be incorporated into current sensing, control, and other circuits or circuit packages, with connections to the terminal pads 28 being established by any suitable process, such as wire bonding. Moreover, where desired, modules of the type described above, may be incorporated into integrated circuit structures with appropriate conducting traces being laid down as a part of the circuit design.

While the invention may be susceptible to various modifications and alternative forms, specific embodiments have been shown in the drawings and have been described in detail herein by way of example only. However, it should be understood that the invention is not intended to be limited to the particular forms disclosed. Rather, the invention is to cover all modifications, equivalents, and alternatives falling within the spirit and scope of the invention as defined by the following appended claims. For example, the capacitors described above could be replaced by various other feedback mechanisms formed with or added to the basic MEMS deflectable beam structure. Current applied to the feedback or readout devices may be AC or DC, although in a presently preferred embodiment two 180° out of phase AC signals are applied to the pair of capacitors described above. Moreover, alternative feedback or readout devices may include optical output devices or piezoelectric devices.

What is claimed is:

1. A current sensor comprising:

a magnetic field source for generating a magnetic field;

a current sensing system including a sensing element and a nulling element, the sensing element disposed in the magnetic field and configured to receive a current to be sensed, the sensing element being deflectable under the influence of the magnetic field and the current, the nulling element being linked to the sensing element and disposed in the magnetic field, the nulling element being configured to receive a nulling current to resist deflection, under the influence of the magnetic field, of the sensing element; and a feedback element coupled to the current sensing system and configured to produce a signal representative of deflection of the sensing element.

2. The sensor of claim 1, wherein the sensing element and the nulling element are generally parallel beams formed by a micromachining operation.

3. The sensor of claim 1, wherein the feedback element includes a capacitive sensor.

4. The sensor of claim 3, wherein the feedback element includes a pair of capacitors coupled to respective nulling elements.

5. The sensor of claim 1, wherein the nulling element comprises a pair of nulling members disposed on sides of and generally parallel to the sensing element.

6. The sensor of claim 1, wherein the magnetic field source includes a permanent magnet.

7. A current sensor comprising:

a magnetic base for producing a magnetic field;

an insulating layer disposed adjacent to the base;

a micromachined current sensing system disposed within the magnetic field over said insulating layer and configured to receive a current to be measured and to deflect under the influence of the current and the magnetic field; and a readout device coupled to the sensing system for determining deflection of the sensing system;

wherein the sensing system further includes at least one micromachined sensing member and at least one micromachined compensation member disposed generally parallel to the sensing member, the compensation member being coupled to the sensing member and configured to receive a compensating current to counter deflection of the sensing member.

8. The current sensor of claim 7, wherein the magnetic base includes a permanent magnet.

9. The current sensor of claim 7, wherein the sensing system includes a sensing member having first and second ends and conductive regions at each of the first and second ends for transmitting current to be measured to and from the sensing member.

10. The current sensor of claim 7, including first and second compensation members disposed on first and second sides of the sensing member.

11. The current sensor of claim 10, wherein the readout device includes first and second capacitors coupled to the first and second compensation members, respectively, the capacitors being configured to provide output signals representative of deflection of the sensing member.

12. The current sensor of claim 7, wherein the readout device includes at least one capacitor coupled to the sensing system for providing output signals representative of deflection of the sensing system.

13. A current sensor comprising:

a magnetic field source for producing a magnetic field;

an elongated sensing element disposed within the magnetic field, the sensing element being configured to receive a current to be measured and to deflect from a normal position under the combined influence of the magnetic field and the current;

first and second compensation elements disposed on first and second sides, respectively, of the sensing element and coupled to the sensing element, each compensation element being configured to receive a compensation current and to restrain the sensing element from deflection under the influence of the magnetic field and the compensation current; and first and second feedback devices coupled to the compensation elements for sensing deflection of the sensing element.

14. The current sensor of claim 13, wherein at least the sensing element and the compensation elements are formed by micromachining.

15. The current sensor of claim 13, wherein the sensing element and the compensation elements are supported at respective ends thereof, and wherein the sensor includes conductive regions for transmitting current to and from the sensing element and the compensation elements.

16. The current sensor of claim 13, wherein the first and second feedback devices each include a capacitive element adapted to produce an output signal indicative of deflection of the sensing element.

17. A current sensor comprising:

a substrate including a magnetic field source and at least one insulating layer;

a device layer disposed over the substrate and forming a deflectable current sensing structure, a readout device, and a link between a portion of the readout device and the sensing structure, the device layer including at least a conductive layer forming conductive paths on the sensing structure and conductive regions on the readout device, and a non-conductive layer forming the link between the readout device and the sensing structure, and a support layer disposed between the device layer and the substrate, the support layer bounding a cavity between the device layer and the substrate to support the sensing structure and the readout device while allowing deflection of the sensing structure under the influence of a measured current and a magnetic field from the field source;

wherein the sensing structure includes a sensing beam for receiving a current to be measured, and a nulling bema for receiving a nulling current.

18. The current sensor of claim 17, wherein the substrate includes a permanent magnet and an electrical isolation layer overlying the permanent magnet.

19. The current sensor of claim 17, wherein the device layer includes a structural layer disposed adjacent to the conductive layer.

20. The current sensor of claim 19, wherein the structural layer consists essentially of silicon or polysilicon.

21. The current sensor of claim 17, wherein the non-conductive layer consists essentially of silicon dioxide.

22. The current sensor of claim 17, wherein the cavity is contiguous with gaps formed between portions of the device layer, the gaps being configured to vary in width during deflection of the sensing structure.

23. The current sensor of claim 17, wherein the sensing beam is coupled to the sensing beam by a link formed in the non-conductive layer.

* * * * *